United States Patent
Wang et al.

(10) Patent No.: US 11,332,038 B1
(45) Date of Patent: May 17, 2022

(54) SYSTEM AND METHOD FOR QUANTIFYING BATTERY USAGE

(71) Applicant: Ford Global Technologies, LLC, Dearborn, MI (US)

(72) Inventors: Rui Wang, Canton, MI (US); Xiao Guang Yang, Northville, MI (US); Baojin Wang, Saline, MI (US); Xu Wang, Northville, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 17/129,618

(22) Filed: Dec. 21, 2020

(51) Int. Cl.
*B60L 58/16* (2019.01)
*G01R 31/387* (2019.01)
*G01R 31/36* (2020.01)
*G01R 31/392* (2019.01)

(52) U.S. Cl.
CPC .......... *B60L 58/16* (2019.02); *G01R 31/3646* (2019.01); *G01R 31/387* (2019.01); *G01R 31/392* (2019.01)

(58) Field of Classification Search
CPC ... B60L 58/16; G01R 31/3646; G01R 31/387; G01R 31/392
See application file for complete search history.

(56) References Cited

U.S. PATENT DOCUMENTS

| | | | | |
|---|---|---|---|---|
| 6,661,231 B1* | 12/2003 | Arai | ........... | G01R 31/3648 324/426 |
| 7,652,448 B2* | 1/2010 | Palladino | .......... | G01R 31/367 320/104 |
| 8,552,687 B2* | 10/2013 | Lin | ........... | B60L 58/10 320/132 |
| 8,862,376 B2 | 10/2014 | Yabuta | | |
| 9,689,366 B2* | 6/2017 | Kirlew | ........... | H02J 7/345 |
| 10,093,303 B2* | 10/2018 | Grider | ........... | B60W 20/00 |
| 2008/0254347 A1* | 10/2008 | Palladino | .......... | H01M 10/48 429/90 |
| 2011/0046834 A1* | 2/2011 | Grider | ........... | B60W 20/00 701/22 |
| 2014/0333317 A1* | 11/2014 | Frost | ........... | G01R 31/382 324/430 |
| 2015/0073632 A1* | 3/2015 | Hill | ........... | B60W 10/28 701/22 |
| 2016/0116546 A1* | 4/2016 | Sung | ........... | H01M 10/48 324/430 |

FOREIGN PATENT DOCUMENTS

WO 2019113828 A1 6/2019
WO 2020044597 A1 3/2020

* cited by examiner

Primary Examiner — Tung S Lau
(74) Attorney, Agent, or Firm — David Kelley; McCoy & Russell LLP (57) ABSTRACT

Methods and system are described for estimating an amount of battery usage for a traction battery of a vehicle. The traction battery usage estimate may be based on or a function of a distance per gallon of gasoline-equivalent so that the usage estimate may be more familiar to vehicle operators. In addition, the traction battery usage estimate may also be based on traction battery current and traction battery voltage.

14 Claims, 5 Drawing Sheets

| | TIME (DAYS) | E-mileage | CHARGE CAPACITY RETENTION (%) |
|---|---|---|---|
| Row 1 ⟶ | 0 | 0 | 100 |
| | 60 | 2465 | 94 |
| | 120 | 4931 | 88 |
| | 500 | 20548 | 83 |
| | 865 | 35548 | 76 |
| | 1230 | 50547 | 72 |
| | 2325 | 95548 | 68 |
| Row 8 ⟶ | 3653 | 150000 | 64 |
| | ↑ Column 1 | ↑ Column 2 | ↑ Column 3 |

SYSTEM AND METHOD FOR QUANTIFYING BATTERY USAGE

FIELD

The present description relates generally to methods and systems for quantifying use of a battery. The battery usage may be applied to estimate battery degradation and expected remaining battery life.

BACKGROUND/SUMMARY

A vehicle may include a traction or propulsion battery that supplies electric power to and receives electric power from an electric machine. The vehicle's manufacturer may warranty the battery for a prescribed amount of time or a prescribed vehicle travel distance. However, the amount of time that a battery is used and a distance that a vehicle is driven may not correlate well with battery degradation and remaining battery life. Therefore, it may be desirable to provide a metric for battery usage that more closely reflects the battery's operational status.

It should be understood that the summary above is provided to introduce in simplified form of a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

DETAILED DESCRIPTION

Figure 1:
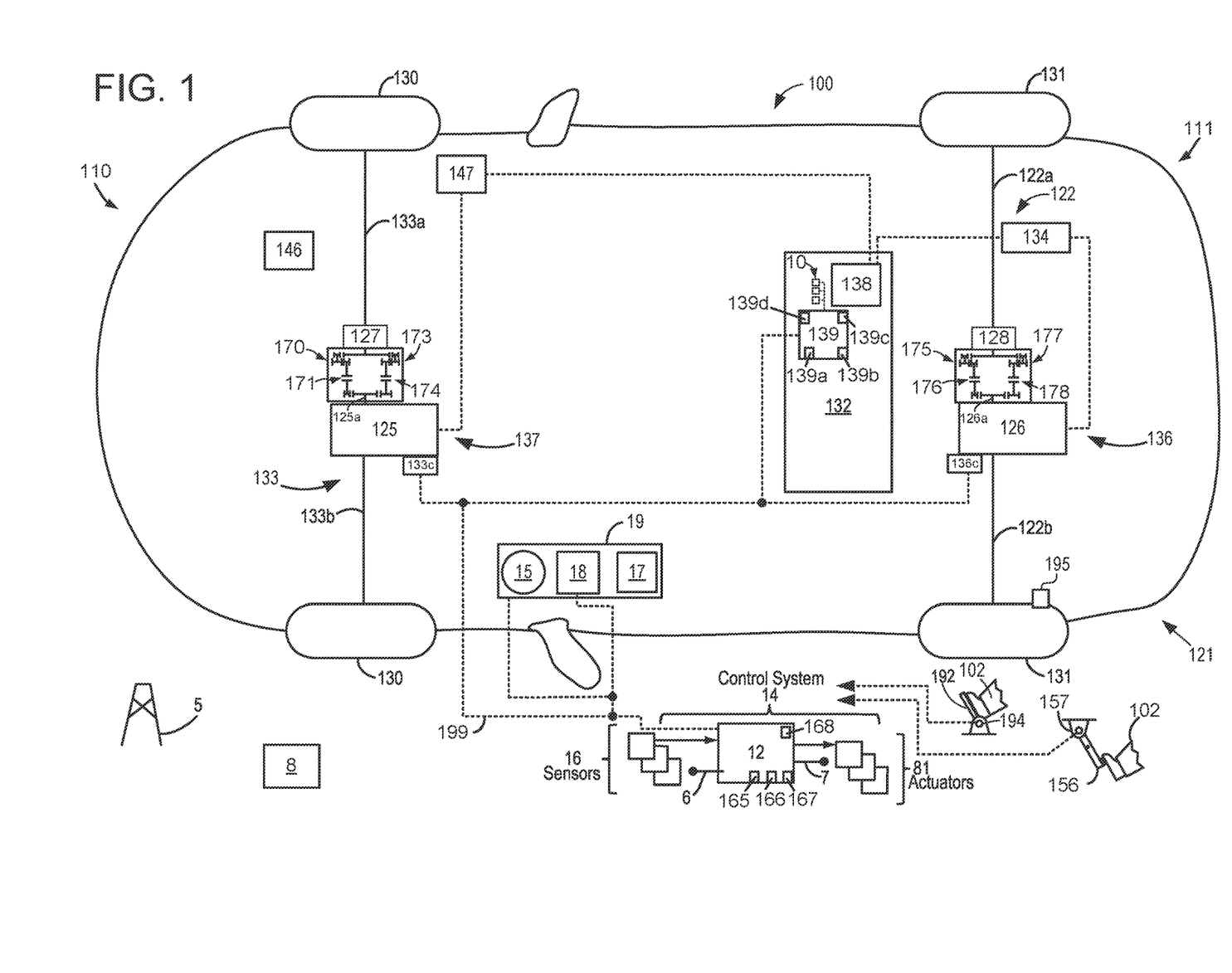
FIG. 1 is a schematic diagram of a vehicle driveline is shown.
Figure 2:
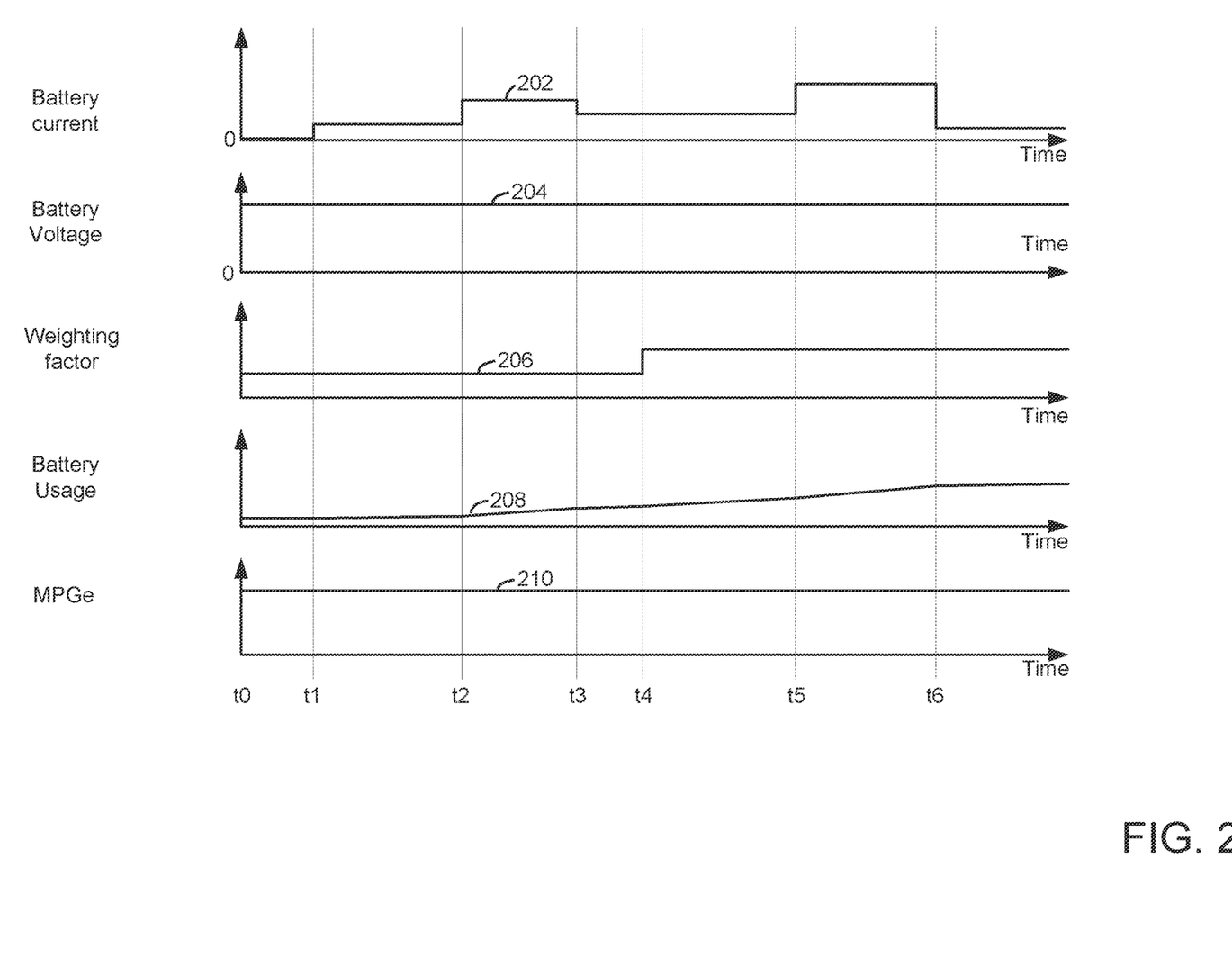
FIG. 2 shows an example sequence that illustrates how a battery's usage metric may be affected by battery operating conditions.
Figure 3:
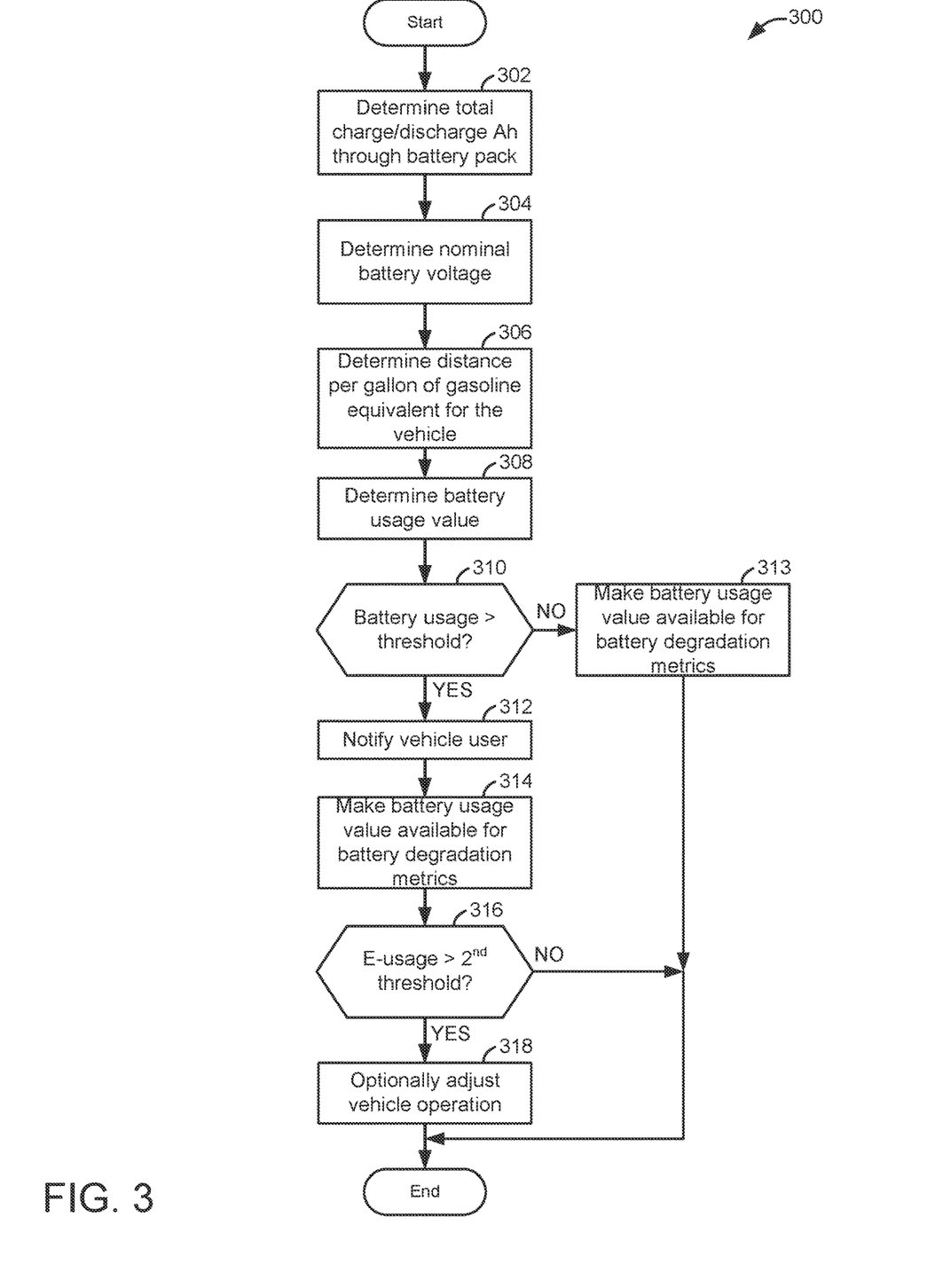
FIG. 3 shows a first flowchart of a method to quantify battery usage over time.
Figure 4:
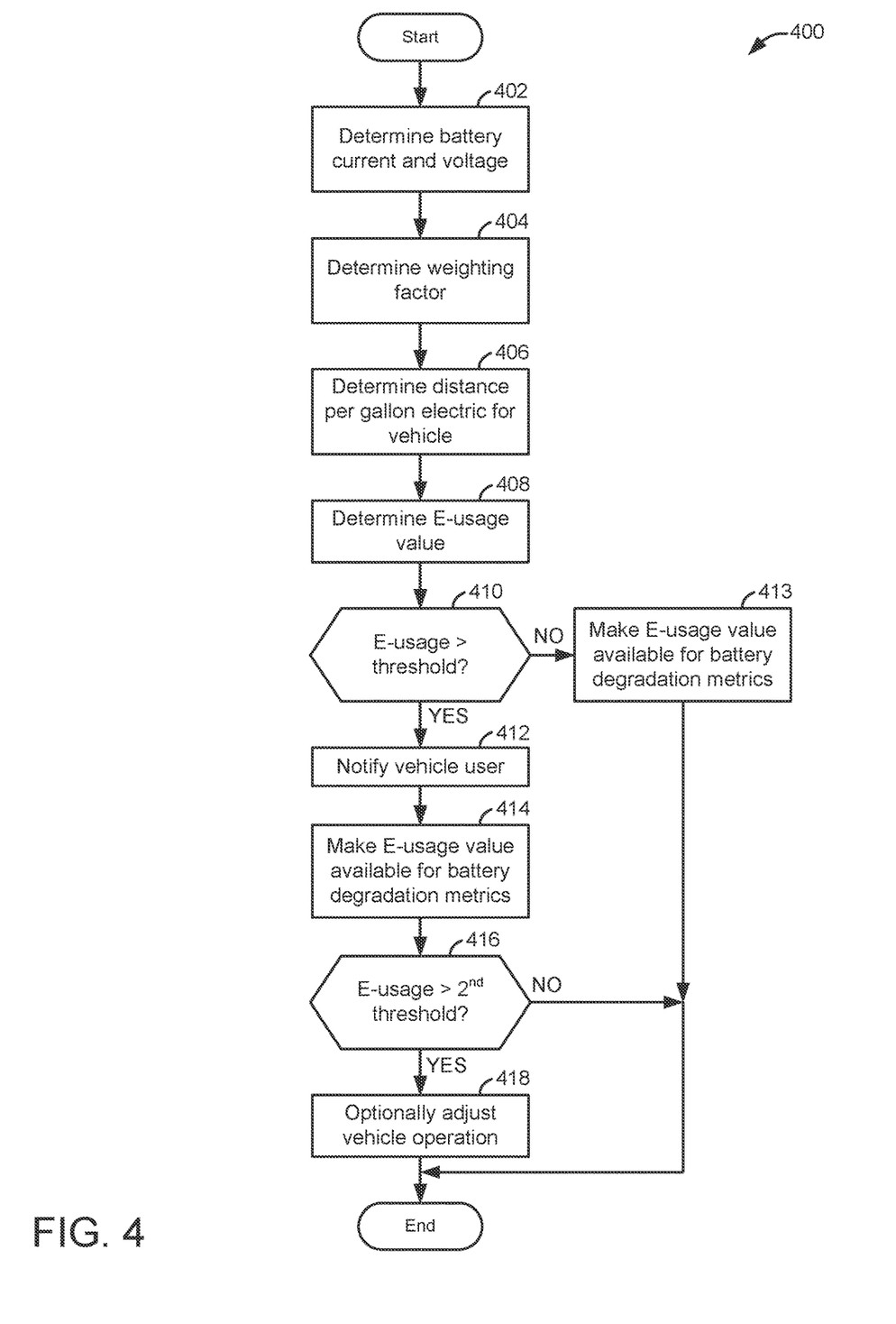
FIG. 4 shows a second flowchart of a method to quantify battery usage over time.
Figure 5:
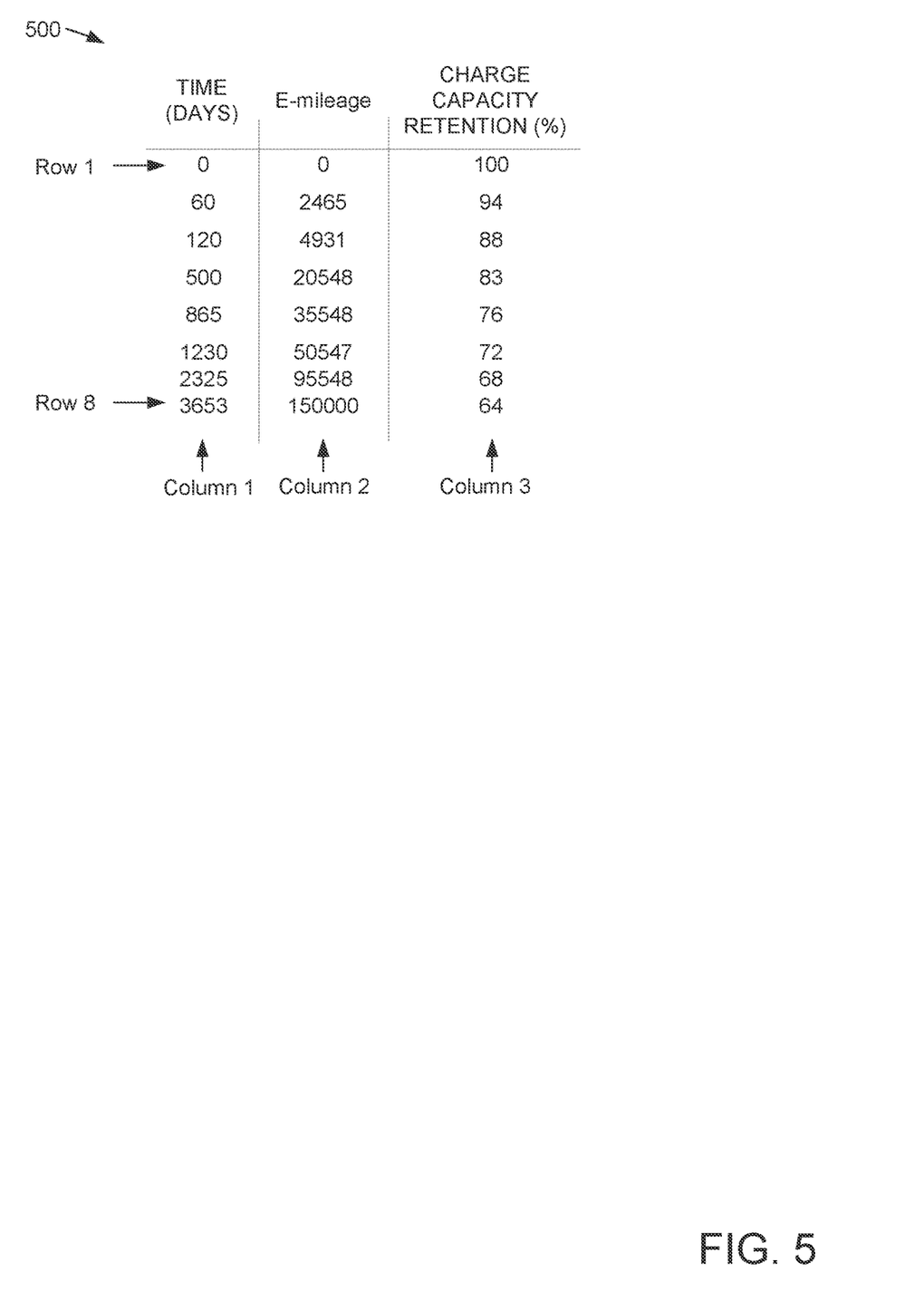
FIG. 5 shows an example battery degradation map that is a function of vehicle usage and a total number of days a vehicle is driven.

The following description relates to systems and methods for quantifying usage of a traction or propulsion battery of a vehicle. The battery usage metric is defined in a way that may make it seem more familiar to those that may not be as well versed in battery terminology. In particular, the battery usage metric may be described in terms of an aggregate distance that the battery has propelled the vehicle. The battery may be included in an electric vehicle as shown in FIG. 1 or a hybrid vehicle. The battery usage metric may increase according to operating conditions as shown in FIG. 2. Example methods for determining a battery usage metric are shown in FIGS. 3 and 4. An example battery degradation map that is a function of vehicle usage and a total number of days a vehicle is driven is shown in FIG. 5.

A traction or propulsion battery may supply electric power to and receive electric power from an electric machine to propel a vehicle. The vehicle's manufacturer may warranty the battery for a prescribed amount of time or a prescribed vehicle travel distance. For example, the battery may be warrantied for 6 years or 160,000 kilometers (km). The warrantee may provide a level of comfort to the vehicle's owner, but the batteries life span may differ from what is provided by the warrantee because of the way the vehicle's owner has operated the vehicle. Consequently, the vehicle's owner may replace the battery when the end of the warrantee approaches, but the battery may have a significant amount of life left. Therefore, it may be desirable to provide a way of determining battery usage in a way that may allow a vehicle owner to have an improved estimate of expected battery life.

The inventors herein have recognized the above-mentioned issues and have developed a method for a battery, comprising: generating a battery usage estimate based on a distance per gallon of gasoline-equivalent, battery current, and battery voltage via a controller; and transferring the battery usage estimate from the controller to a device external to the controller.

By generating a battery usage estimate that is based on a distance per gallon of gasoline-equivalent, it may be possible to provide a technical result of generating a battery use metric that may be more intuitively understandable to some users. Further, the battery use metric may allow vehicle operators to make a more informed decision regarding whether or not a battery should be serviced.

The present description may provide several advantages. In particular, the approach may allow vehicle operators to have a better understanding of battery use and remaining battery life. Further, the approach may be implemented in different ways depending on the accuracy and sophistication level that is desired. Further still, the approach may be applied to electric only vehicles or hybrid vehicles.

FIG. 1 illustrates an example vehicle propulsion system 100 for vehicle 121. A front portion of vehicle 121 is indicated at 110 and a rear portion of vehicle 121 is indicated at 111. Vehicle propulsion system 100 includes at two propulsion sources including front electric machine 125 and rear electric machine 126. Electric machines 125 and 126 may consume or generate electrical power depending on their operating mode. Throughout the description of FIG. 1, mechanical connections between various components are illustrated as solid lines, whereas electrical connections between various components are illustrated as dashed lines.

Vehicle propulsion system 100 has a front axle 133 and a rear axle 122. In some examples, rear axle may comprise two half shafts, for example first half shaft 122a, and second half shaft 122b. Likewise, front axle 133 may comprise a first half shaft 133a and a second half shaft 133b. Vehicle propulsion system 100 further has front wheels 130 and rear wheels 131. In this example, front wheels 130 may be selectively driven via electric machine 125. Rear wheels 131 may be driven via electric machine 126.

The rear axle 122 is coupled to electric machine 126. Rear drive unit 136 may transfer power from electric machine 126 to axle 122 resulting in rotation of drive wheels 131. Rear drive unit 136 may include a low gear set 175 and a high gear 177 that are coupled to electric machine 126 via output shaft 126a of rear electric machine 126. Low gear 175 may be engaged via fully closing low gear clutch 176. High gear 177 may be engaged via fully closing high gear clutch 178. High gear clutch 178 and low gear clutch 176 may be opened and closed via commands received by controller 136c of rear drive unit 136 (e.g., rear drive unit controller 136c) over controller area network (CAN) 199. Alternatively, high gear clutch 178 and low gear clutch 176 may be opened and closed via digital outputs or pulse widths provided via control system 14. Rear drive unit 136 may include differential 128 so that torque may be provided to axle 122a and to axle 122b. In some examples, an electrically controlled differential clutch (not shown) may be included in rear drive unit 136.

The front axle 133 is coupled to electric machine 125. Front drive unit 137 may transfer power from electric machine 125 to axle 133 resulting in rotation of drive wheels 130. Front drive unit 137 may include a low gear set 170 and a high gear 173 that are coupled to electric machine 125 via output shaft 125a of front electric machine 125. Low gear 170 may be engaged via fully closing low gear clutch 171. High gear 173 may be engaged via fully closing high gear clutch 174. High gear clutch 174 and low gear clutch 171 may be opened and closed via commands received by controller 133c over CAN 199. Alternatively, high gear clutch 174 and low gear clutch 171 may be opened and closed via digital outputs or pulse widths provided via control system 14. Front drive unit 137 may include differential 127 so that torque may be provided to axle 133a and to axle 133b. In some examples, an electrically controlled differential clutch (not shown) may be included in rear drive unit 137.

Electric machines 125 and 126 may receive electrical power from onboard electrical energy storage device 132 (e.g., a traction or propulsion battery). Furthermore, electric machines 125 and 126 may provide a generator function to convert the vehicle's kinetic energy into electrical energy, where the electrical energy may be stored at electric energy storage device 132 for later use by the electric machine 125 and/or electric machine 126. A first inverter system controller (ISC1) 134 may convert alternating current generated by rear electric machine 126 to direct current for storage at the electric energy storage device 132 and vice versa. A second inverter system controller (ISC2) 147 may convert alternating current generated by front electric machine 125 to direct current for storage at the electric energy storage device 132 and vice versa. Electric energy storage device 132 may be a battery, capacitor, inductor, or other electric energy storage device.

In some examples, electric energy storage device 132 may be configured to store electrical energy that may be supplied to other electrical loads residing on-board the vehicle (other than the motor), including cabin heating and air conditioning, engine starting, headlights, cabin audio and video systems, etc. Further, in some examples, only the front axle or only the rear axle includes an electric machine to propel the vehicle.

Control system 14 may communicate with one or more of electric machine 125, electric machine 126, energy storage device 132, etc. via CAN 199. Control system 14 may receive sensory feedback information from one or more of electric machine 125, electric machine 126, energy storage device 132, etc. Further, control system 14 may send control signals to one or more of electric machine 125, electric machine 126, energy storage device 132, etc., responsive to this sensory feedback. Control system 14 may receive an indication of an operator requested output of the vehicle propulsion system from a human operator 102, or an autonomous controller. For example, control system 14 may receive sensory feedback from pedal position sensor 194 which communicates with pedal 192. Pedal 192 may refer schematically to a propulsive effort pedal. Similarly, control system 14 may receive an indication of an operator requested vehicle braking via a human operator 102, or an autonomous controller. For example, control system 14 may receive sensory feedback from pedal position sensor 157 which communicates with brake pedal 156. Control system 14 may also communicate with other vehicles via vehicle to vehicle (V2V) communications system 6. Control system 14 may also communicate with infrastructure 8 via vehicle to infrastructure (V2I) communications system 7. Infrastructure 8 may include but is not limited to external computer servers, computer servers at vehicle service centers, and traffic control infrastructure computer servers.

Energy storage device 132 may periodically receive electrical energy from a power source such as a stationary power grid 5 residing external to the vehicle (e.g., not part of the vehicle). As a non-limiting example, vehicle propulsion system 100 may be configured as a plug-in electric vehicle (EV), whereby electrical energy may be supplied to energy storage device 132 via the power grid 5.

Electric energy storage device 132 includes an electric energy storage device controller 139 and a power distribution module 138. Electric energy storage device controller 139 may provide charge balancing between energy storage element (e.g., battery cells), battery usage estimates, and communication with other vehicle controllers (e.g., controller 12). Electric energy storage device controller 139 may monitor battery current, battery voltage, and battery temperature via battery sensors 10. Electric energy storage device controller 139 includes non-transitory (e.g., read only memory) 139a, random access memory 139b, digital inputs/outputs 1139d, and a microcontroller 139c. Power distribution module 138 controls flow of power into and out of electric energy storage device 132.

One or more wheel speed sensors (WSS) 195 may be coupled to one or more wheels of vehicle propulsion system 100. The wheel speed sensors may detect rotational speed of each wheel. Such an example of a WSS may include a permanent magnet type of sensor.

Vehicle propulsion system 100 may further include a motor electronics coolant pump (MECP) 146. MECP 146 may be used to circulate coolant to diffuse heat generated by at least electric machine 120 of vehicle propulsion system 100, and the electronics system. MECP may receive electrical power from onboard energy storage device 132, as an example.

Controller 12 may comprise a portion of a control system 14. In some examples, controller 12 may be a single controller of the vehicle. Control system 14 is shown receiving information from a plurality of sensors 16 (various examples of which are described herein) and sending control signals to a plurality of actuators 81 (various examples of which are described herein). As one example, sensors 16 may include tire pressure sensor(s) (not shown), wheel speed sensor(s) 195, etc. In some examples, sensors associated with electric machine 125, electric machine 126, wheel speed sensor 195, etc., may communicate information to controller 12, regarding various states of electric machine operation. Controller 12 includes non-transitory (e.g., read only memory) 165, random access memory 166, digital inputs/outputs 168, and a microcontroller 167. Controller 12 may also perform calculations and tasks that may be performed via electric energy storage device controller 139.

Vehicle propulsion system 100 may also include an on-board navigation system 17 (for example, a Global Positioning System) on dashboard 19 that an operator of the vehicle may interact with. The navigation system 17 may include one or more location sensors for assisting in estimating a location (e.g., geographical coordinates) of the vehicle. For example, on-board navigation system 17 may receive signals from GPS satellites (not shown), and from the signal identify the geographical location of the vehicle.

In some examples, the geographical location coordinates may be communicated to controller 12.

Dashboard 19 may further include a display system 18 configured to display information to the vehicle operator. Display system 18 may comprise, as a non-limiting example, a touchscreen, or human machine interface (HMI), display which enables the vehicle operator to view graphical information as well as input commands. In some examples, display system 18 may be connected wirelessly to the internet (not shown) via controller (e.g. 12). As such, in some examples, the vehicle operator may communicate via display system 18 with an internet site or software application (app).

Dashboard 19 may further include an operator interface 15 via which the vehicle operator may adjust the operating status of the vehicle. Specifically, the operator interface 15 may be configured to initiate and/or terminate operation of the vehicle driveline (e.g., electric machine 125 and electric machine 126) based on an operator input. Various examples of the operator ignition interface 15 may include interfaces that require a physical apparatus, such as an active key, that may be inserted into the operator interface 15 to start the electric machines 125 and 126 and to turn on the vehicle, or may be removed to shut down the electric machines 125 and 126 to turn off the vehicle. Other examples may include a passive key that is communicatively coupled to the operator interface 15. The passive key may be configured as an electronic key fob or a smart key that does not have to be inserted or removed from the interface 15 to operate the vehicle electric machines 125 and 126. Rather, the passive key may need to be located inside or proximate to the vehicle (e.g., within a threshold distance of the vehicle). Still other examples may additionally or optionally use a start/stop button that is manually pressed by the operator to start or shut down the electric machines 125 and 126 to turn the vehicle on or off. In other examples, a remote electric machine start may be initiated remote computing device (not shown), for example a cellular telephone, or smartphone-based system where a user's cellular telephone sends data to a server and the server communicates with the vehicle controller 12 to start the engine. The devices included in dashboard 19 may communicate with controller 12 via CAN 199.

The system of FIG. 1 provides for a vehicle system, comprising: a traction battery; and a controller including executable instructions stored in non-transitory memory that cause the controller to generate an estimate of battery usage based on a distance per gallon of gasoline-equivalent, traction battery current, traction battery voltage, and a weighting factor, the controller including additional instructions that cause the controller to transfer the estimate of battery usage to a device external to the controller. The vehicle system includes where the weighting factor is based on a traction battery state of charge, a traction battery current pulse duration, traction battery temperature, and traction battery current. The vehicle system includes where the device is a human/machine interface. The vehicle system includes where the device is a second controller. The vehicle system includes where the traction battery current is an electric discharge current. The vehicle system includes where the traction battery current is an electric charging current. The vehicle system further comprises additional executable instructions to integrate the traction battery current multiplied by the traction battery voltage.

Referring now to FIG. 2, a prophetic vehicle operating sequence according to the method of FIG. 4 is shown. The vehicle and battery operating sequence shown in FIG. 2 may be provided via the method of FIG. 4 in cooperation with the system shown in FIG. 1. The plots shown in FIG. 2 occur at the same time and are aligned in time. The vertical lines at t0-t6 represent times of interest during the sequence.

The first plot from the top of FIG. 2 is a plot of traction battery current versus time. The vertical axis represents battery current and the battery current increases in the direction of the vertical axis arrow. The horizontal axis represents time and time increases from the left side of the figure to the right side of the figure. Trace 202 represents the battery current.

The second plot from the top of FIG. 2 is a plot of traction battery voltage versus time. The vertical axis represents the battery voltage and the battery voltage increases in the direction of the vertical axis arrow. The horizontal axis represents time and time increases from the left side of the figure to the right side of the figure. Line 204 represents the battery voltage.

The third plot from the top of FIG. 2 is a plot of a value of a weighting factor versus time. The vertical axis represents the value of the weighting factor and the weighting factor value increases in the direction of the vertical axis arrow. The horizontal axis represents time and time increases from the left side of the figure to the right side of the figure. Trace 206 represents the weighting factor value.

The fourth plot from the top of FIG. 2 is a plot of battery usage value (e.g., a value described in terms of an aggregate distance hypothetically traveled by a vehicle that is propelled via power from a battery, which may be referred to as electric mileage or E-mileage) versus time. The vertical axis represents the battery usage value and battery usage increases in the direction of the vertical axis arrow. The horizontal axis represents time and time increases from the left side of the figure to the right side of the figure. Trace 208 represents the battery usage value.

The fifth plot from the top of FIG. 2 is a plot of a distance per gallon of gasoline-equivalent value versus time. The vertical axis represents the distance per gallon of gasoline-equivalent and the distance per gallon of gasoline-equivalent value increases in the direction of the vertical axis arrow. The horizontal axis represents time and time increases from the left side of the figure to the right side of the figure. Trace 210 represents the distance per gallon of gasoline-equivalent value (e.g., miles per gallon of gasoline-equivalent MPGe).

At time t0, the battery current is zero and the battery voltage is at a higher level. The weighting factor is at a lower level and the battery usage value is not changing. The distance per gallon of gasoline-equivalent value is at a higher constant level.

At time t1, the battery current increases and the battery voltage remains at its previous level. The weighting factor remains at its previous level and the battery usage value begins to increase at a first rate. The distance per gallon of gasoline-equivalent value remains at its previous level.

At time t2, the battery current increases a second time and the battery voltage remains at its previous level. The weighting factor is unchanged and the battery usage value begins to increase at a second rate, the second rate being greater than the first rate. The battery usage amount increases as a function of the battery current. The distance per gallon of gasoline-equivalent value remains at its previous level.

At time t3, the battery current is reduced and the battery voltage remains at its previous level. The weighting factor is unchanged and the battery usage value changes at a third, the third rate less than the second rate and greater than the first rate. The distance per gallon of gasoline-equivalent value remains at its previous level.

At time t4, the battery current remains unchanged from its value at time t3 and the battery voltage is unchanged. The weighting factor increases, which in turn causes the battery usage value to increase at a fourth rate. The weighting factor may increase due to a battery temperature change or battery state of charge (SOC) change, for example. The distance per gallon of gasoline-equivalent value remains unchanged.

At time t5, the battery current increases a third time and the battery voltage remains at its previous level. The weighting factor is unchanged and the battery usage value begins to increase at a fifth rate, the fifth rate being greater than the second rate. The battery usage amount increases at a higher rate since the battery current has increased and since the weighting factor is at a larger value. The distance per gallon of gasoline-equivalent value remains at its previous level.

At time t6, the battery current decreases a second time and the battery voltage remains at its previous level. The weighting factor is unchanged and the battery usage value begins to increase at a lower rate since the battery current level is small. The distance per gallon of gasoline-equivalent value remains at its previous level.

In this way, the battery usage rate may change with battery operating conditions. The battery usage increases while the battery is supplying or receiving electric current. The battery usage may increase over the battery's life as the battery usage rate increases and decreases.

Referring now to FIG. 3, an example method for operating a vehicle that includes a traction battery is shown. The method of FIG. 3 may be incorporated into and may cooperate with the system of FIG. 1. Further, at least portions of the method of FIG. 3 may be incorporated as executable instructions stored in non-transitory memory of a controller while other portions of the method may be performed via the controller transforming operating states of devices and actuators in the physical world.

At 302, method 300 determines an actual total charging electric current (e.g., Ah (Ampere hours)) through the traction battery since the traction battery was installed in the vehicle. The actual total charging electric current may be determined via an electric current sensor that monitors electric current flow into and out of the traction battery. The charging electric current is current that enters the traction battery.

Alternatively, method 300 may determine an actual total discharging electric current through the traction battery since the traction battery was installed in the vehicle. The actual total discharging electric current may be determined via an electric current sensor that monitors electric current flow out of the traction battery. Method 300 proceeds to 304.

At 304, method 300 determines a nominal battery voltage. In one example, the nominal battery voltage may be determined by multiplying the total number of battery cells that are in series with the rated voltage of the battery cells (e.g., 3.7 volts). Alternatively, the nominal battery voltage may be measured via a volt meter or A/D converter in the battery controller when the battery is fully charged while current is not being supplied to or from the battery. Method 300 proceeds to 306.

At 306, method 300 determines a distance per gallon of gasoline equivalent for the vehicle. In one example, the distance per gallon of gasoline equivalent may be determined for a distance in miles, but other distances may be used. Thus, the distance per gallon of gasoline equivalent may be referred to as miles per gallon of gasoline equivalent. The miles per gallon of gasoline value for the vehicle may be stored in controller memory and retrieved from memory. The miles per gallon of gasoline equivalent may be determined according to 115,000 British thermal units produced by combusting a gallon of gasoline. It takes 33.7 kilowatts hours of electricity to generate the same amount of heat. Therefore, if the vehicle can travel 60 miles on 33.7 kilowatts, the vehicle would be rated at 60 miles per gallon of gasoline-equivalent. The equivalent is the electric power to travel the distance of 60 miles. Method 300 proceeds to 308.

At 308, method 300 determines the battery usage value. In one example, the battery usage value may be determined via the following equation:

$$E\text{-mileage} = \frac{\frac{Q_d \times V_{nom}}{1000}}{33.7} \times MPG_e$$

where E-mileage is the battery usage value, $Q_d$ is the actual total battery discharge current (Ah) since the battery was installed in the vehicle, $V_{nom}$ is the nominal traction battery voltage, and MPGe is the miles per gallon gasoline equivalent. It should be noted that although miles, gallons, and gasoline are used in this example to determine the battery usage value, these units and type of fuel may be replaced by similar parameters. For example, liters may be substituted for gallons, diesel fuel may be substituted for gasoline, and kilometers may be substituted for miles.

Alternatively, the battery usage value may be determined via the following equation:

$$E\text{-mileage} = \frac{\frac{Q_c \times V_{nom}}{1000}}{33.7} \times MPG_e$$

where E-mileage is the battery usage value, $Q_c$ is the actual total battery charge current (Ah) since the battery was installed in the vehicle, $V_{nom}$ is the nominal traction battery voltage, and MPGe is the miles per gallon gasoline equivalent. Again, although miles, gallons, and gasoline are used in this example to determine the battery usage value, these units and type of fuel may be replaced by similar parameters. Method 300 proceeds to 310.

At 310, method 300 judges whether or not the battery usage level or amount is greater than a threshold. If so, the answer is yes and method 300 proceeds to 312. Otherwise, the answer is no and method 300 proceeds to 313.

At 313, method 300 makes the battery usage value available for battery degradation metrics, display to vehicle occupants, vehicle service scheduling, and infrastructure. In one example, a battery controller may transmit or transfer the battery usage value to other controllers on-board or off-board of the vehicle. For example, the battery controller may transfer the battery usage value to a controller that displays the value to vehicle occupants via a human/machine interface. Further, the battery controller may transfer the battery usage value to infrastructure so that the state of the vehicle may be determined. In addition, the battery controller may estimate battery degradation from a map that defines battery charge capacity retention percentage (e.g., a measure of battery degradation) as a function of battery usage and a total number of days a vehicle is driven as shown in FIG. 5 and described further below. The battery controller may display the battery degradation value to vehicle occupants via transferring or transmitting the battery degradation value to another controller in the vehicle to display on a human/machine interface. In still other examples, the battery degradation value may be transmitted off-board the vehicle to a remote server so that vehicle service may be scheduled. Method 300 proceeds to exit.

At 312, method 300 notifies the vehicle user (e.g., a human) that the battery usage exceeds a threshold value. The notification may be via displaying a message on a human/machine interface. In addition, method 300 may automatically schedule the vehicle for service of the battery via sending a vehicle service request to remote infrastructure. Method 300 proceeds to 314.

At 314, method 300 makes the battery usage value available for battery degradation metrics, display to vehicle occupants, vehicle service scheduling, and infrastructure as described at 313. Method 300 proceeds to 316.

At 316, method 300 judges whether or not the battery usage level or amount is greater than a second threshold. If so, the answer is yes and method 300 proceeds to 318. Otherwise, the answer is no and method 300 exits.

At 318, method 300 optionally adjusts vehicle operation. In one example, method 300 may adjust a relationship between propulsive pedal position and requested wheel torque such that greater application of the propulsive pedal may be required to generate middle level driver demand torques. In this way, the responsiveness of the electric machines may be reduced so that current may be drawn from the battery at a lower rate, thereby extending the life of the battery. Of course, full driver demand torque may be made available at the greatest application position of the propulsive effort pedal.

In another example, method 300 may reduce a rate of charging or electric current that may be accepted by the battery to extend battery life. In still other examples, selected vehicle modes may not be permitted or other modes that are not normally available may be made available. For example, only two wheel drive mode may be made available to further conserve battery charge capacity and to extend battery life. Method 300 proceeds to exit.

In this way, battery usage may be determined in a less sophisticated way as compared to the way described in FIG. 4. The battery usage metric may be the basis for indicating battery state to vehicle occupants and to schedule vehicle service.

Referring now to FIG. 4 a second method for operating a vehicle that includes a traction battery is shown. The method of FIG. 4 may be incorporated into and may cooperate with the system of FIG. 1. Further, at least portions of the method of FIG. 4 may be incorporated as executable instructions stored in non-transitory memory of a controller while other portions of the method may be performed via the controller transforming operating states of devices and actuators in the physical world.

At 402, method 400 determines traction battery voltage and electric current. The traction battery voltage may be determined via an A/D converter within a controller. The traction battery current may be determined via a current sensor that is input to the controller. Method 400 proceeds to 404.

At 404, method 400 determines a value of a weighting factor. In one example, the weighting factor may be determined from a plurality of individual weights W1, W2, W3, and W4. For example, the weighting factor may be determined from the following equation:

$$W = W1 \times W2 \times W3 \times W4$$

where W is the weighting factor, W1 is a weight that is based on traction battery temperature (T(t)), W2 is a weight that is based on traction battery current (I(t)), W3 is a weight that is based on traction battery state of charge (SOC(t)), and W4 is a weight that is based on a duration of an electric current pulse P(t) duration. In one example, W1 may have a value of 1.2 if traction battery temperature is greater than 50° C. W2 may have a value of 2.0 when I(t) is ≥5 Amperes. Method 400 proceeds to 406.

At 406, method 400 determines a distance per gallon of gasoline equivalent for the vehicle. The distance per gallon of gasoline equivalent may be determined as described at 306. Method 400 proceeds to 408.

At 408, method 400 determines the battery usage value. In one example, the battery usage value may be determined via the following equation:

$$E\text{-mileage} = f(I, T, SOC, MPGe, V, SOC, P)$$
$$= \frac{1}{2} \int \frac{|I(t)| \cdot V(t)dt \cdot W(T(t), I(t), SOC(t), P(t))}{33.7 \times 1000} \times MPG_e$$

where E-mileage is the battery usage value, f is a function that returns the battery usage value, I is traction battery current, T is traction battery temperature, SOC is traction battery SOC, V is traction battery voltage, P is traction battery current pulse duration, t is time, and W is the weighting factor as previously described. Method 400 proceeds to 410.

At 410, method 400 judges whether or not the battery usage level or amount is greater than a threshold. If so, the answer is yes and method 400 proceeds to 412. Otherwise, the answer is no and method 400 proceeds to 413.

At 413, method 400 makes the battery usage value available for battery degradation metrics, display to vehicle occupants, vehicle service scheduling, and infrastructure. In one example, a battery controller may transmit or transfer the battery usage value to other controllers on-board or off-board of the vehicle. For example, the battery controller may transfer the battery usage value to a controller that displays the value to vehicle occupants via a human/machine interface. Further, the battery controller may transfer the battery usage value to infrastructure so that the state of the vehicle may be determined. In addition, the battery controller may estimate battery degradation from a map that defines battery charge capacity retention percentage (e.g., a measure of battery degradation) as a function of battery usage and a total number of days a vehicle is driven as shown in FIG. 5 and described further below. The battery controller may display the battery degradation value to vehicle occupants via transferring or transmitting the battery degradation value to another controller in the vehicle to display on a human/machine interface. In still other examples, the battery degradation value may be transmitted off-board the vehicle to a remote server so that vehicle service may be scheduled. Method 300 proceeds to exit.

At 412, method 400 notifies the vehicle user (e.g., a human) that the battery usage exceeds a threshold value. The notification may be via displaying a message on a human/machine interface. In addition, method 400 may automatically schedule the vehicle for service of the battery via sending a vehicle service request to remote infrastructure. Method 400 proceeds to 414.

At 414, method 300 makes the battery usage value available for battery degradation metrics, display to vehicle occupants, vehicle service scheduling, and infrastructure as described at 413. Method 400 proceeds to 416.

At 416, method 400 judges whether or not the battery usage level or amount is greater than a second threshold. If so, the answer is yes and method 400 proceeds to 418. Otherwise, the answer is no and method 400 exits.

At 418, method 400 optionally adjusts vehicle operation. In one example, method 400 may adjust a relationship between propulsive pedal position and requested wheel torque such that greater application of the propulsive pedal may be required to generate middle level driver demand torques. In this way, the responsiveness of the electric machines may be reduced so that current may be drawn from the battery at a lower rate, thereby extending the life of the battery. Of course, full driver demand torque may be made available at the greatest application position of the propulsive effort pedal.

In another example, method 400 may reduce a rate of charging or electric current that may be accepted by the battery to extend battery life. In still other examples, selected vehicle modes may not be permitted or other modes that are not normally available may be made available. For example, only two wheel drive mode may be made available to further conserve battery charge capacity and to extend battery life. Method 400 proceeds to exit.

In this way, battery usage may be determined in a more sophisticated way that may be more accurate than the method of FIG. 3. The battery usage metric may be the basis for indicating battery state to vehicle occupants and to schedule vehicle service.

Thus, the methods of FIGS. 3 and 4 may provide a method for a battery, comprising: generating a battery usage estimate based on a distance per gallon of gasoline-equivalent, battery current, and battery voltage via a controller; and transferring the battery usage estimate from the controller to a device external to the controller. The method includes where the device is a display or user interface. The method includes where the device is a second controller. The method further comprises transferring the battery usage estimate to the second controller via a controller area network. The method includes where the battery current is multiplied by the voltage. The method includes where the battery current is a battery discharge current. The method includes where the battery current is a battery charging current. The method includes where the gallon of gasoline-equivalent is 33.7 kilowatt-hours of electric power.

The methods of FIGS. 3 and 4 also provide for a method for a battery, comprising: generating a battery usage estimate based on a distance per gallon of gasoline-equivalent, battery current, and battery voltage via a controller; generating a battery capacity retention value from the battery usage estimate and an actual total number of days of vehicle usage; and transferring the battery capacity retention value or a battery state of health value from the controller to a device external to the controller. The method includes where the battery state of health value is determined via the battery capacity retention value. The method includes where the battery capacity retention value is a function of an actual total distance a vehicle is driven. The method includes where the battery capacity retention value is a function of an actual total number of days a vehicle is driven. The method includes where the distance per gallon of gasoline-equivalent is based on 33.7 kilowatt-hours of electric power.

Referring now to FIG. 5, an example map for estimating degradation of a battery is shown. Map 500 includes eight rows as indicated and three columns as indicated. The first row represents an actual total number of days that the electric vehicle is operated to travel. The second row represents the battery usage, E-mileage in this example. The third column represents the battery's charge retention capacity relative to the battery's charge retention capacity when the battery is new.

The map may be referenced via the actual total number of days that the electric vehicle is operated or via the battery usage. For example, if the actual total number of days the vehicle is used is 500, the charge retention is expected to be 83%. If the battery usage is 35,548, then the charge capacity is expected to be 76%. The capacity retention may be determined via the following equation:

$$\text{Charge\_cap} = \min(f(\text{miles}), g(\text{days}))$$

where Charge capacity is the battery charge capacity, min is a function that returns the lesser value of argument f(miles) and g(days), f is a function that returns a traction battery charge capacity as a function of E-mileage, g is a function that returns a traction battery charge capacity as a function of an actual total number of days the vehicle is used. The functions f and g may access a map that is similar to map 500. The battery's state of health may be determined via comparing the battery's present charge capacity to a worst case battery charge capacity.

Note that the example control and estimation routines included herein can be used with various engine and/or vehicle system configurations. The control methods and routines disclosed herein may be stored as executable instructions in non-transitory memory and may be carried out by the control system including the controller in combination with the various sensors, actuators, and other engine hardware. Further, portions of the methods may be physical actions taken in the real world to change a state of a device. The specific routines described herein may represent one or more of any number of processing strategies such as event-driven, interrupt-driven, multi-tasking, multi-threading, and the like. As such, various actions, operations, and/or functions illustrated may be performed in the sequence illustrated, in parallel, or in some cases omitted. Likewise, the order of processing is not necessarily required to achieve the features and advantages of the example examples described herein, but is provided for ease of illustration and description. One or more of the illustrated actions, operations and/or functions may be repeatedly performed depending on the particular strategy being used. Further, the described actions, operations and/or functions may graphically represent code to be programmed into non-transitory memory of the computer readable storage medium in the engine control system, where the described actions are carried out by executing the instructions in a system including the various engine hardware components in combination with the electronic controller. One or more of the method steps described herein may be omitted if desired.

It will be appreciated that the configurations and routines disclosed herein are exemplary in nature, and that these specific examples are not to be considered in a limiting sense, because numerous variations are possible. For example, the above technology can be applied to V-6, I-4, I-6, V-12, opposed 4, and other engine types. The subject matter of the present disclosure includes all novel and non-obvious combinations and sub-combinations of the various systems and configurations, and other features, functions, and/or properties disclosed herein.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. A method for a battery, comprising:
generating a battery usage estimate based on a distance per gallon of gasoline-equivalent, battery current, and battery voltage, and a weighting factor via a controller, where the weighting factor is based on a traction battery state of charge, a traction battery current pulse duration, traction battery temperature, and traction battery current; and
transferring the battery usage estimate from the controller to a device external to the controller.

2. The method of claim 1, where the device is a display or user interface.

3. The method of claim 1, where the battery current is multiplied by the battery voltage.

4. The method of claim 1, where the battery current is battery discharge current.

5. The method of claim 1, where the battery current is battery charging current.

6. The method of claim 1, where the gallon of gasoline-equivalent is 33.7 kilowatt-hours of electric power.

7. The method of claim 2, where the device is a second controller.

8. The method of claim 7, further comprising transferring the battery usage estimate to the second controller via a controller area network.

9. A vehicle system, comprising:
a traction battery; and
a controller including executable instructions stored in non-transitory memory that cause the controller to generate an estimate of battery usage based on a distance per gallon of gasoline-equivalent, traction battery current, traction battery voltage, and a weighting factor, the controller including additional instructions that cause the controller to transfer the estimate of battery usage to a device external to the controller, where the weighting factor is based on a traction battery state of charge, a traction battery current pulse duration, traction battery temperature, and traction battery current.

10. The vehicle system of claim 9, where the device is a human/machine interface.

11. The vehicle system of claim 9, where the device is a second controller.

12. The vehicle system of claim 9, where the traction battery current is an electric discharge current.

13. The vehicle system of claim 9, where the traction battery current is an electric charging current.

14. The vehicle system of claim 9, further comprising additional executable instructions to integrate the traction battery current multiplied by the traction battery voltage.

* * * * *